(12) United States Patent
Proejts et al.

(10) Patent No.: US 11,747,381 B2
(45) Date of Patent: Sep. 5, 2023

(54) CAPACITIVE DETECTION OF ANTENNA CONFIGURATION USING A PROXIMITY SENSOR

(71) Applicant: Dell Products L.P., Round Rock, TX (US)

(72) Inventors: Lars Fredrik Proejts, Taipei (TW); Ravichandra Rama, Leander, TX (US); Suresh Ramasamy, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 16 days.

(21) Appl. No.: 17/380,188

(22) Filed: Jul. 20, 2021

(65) Prior Publication Data

US 2023/0022822 A1 Jan. 26, 2023

(51) Int. Cl.
 *G01R 29/08* (2006.01)
(52) U.S. Cl.
 CPC ..... *G01R 29/0878* (2013.01); *G01R 29/0892* (2013.01)
(58) Field of Classification Search
 CPC ............ G01R 29/0878; G01R 29/0892; H01Q 1/007; H01Q 1/1257; H01Q 1/2291; H01Q 25/007; H01Q 3/26; H01Q 3/28; H01Q 3/34; H01Q 3/00; H01Q 25/00
 See application file for complete search history.

(56) References Cited

U.S. PATENT DOCUMENTS

| | | | |
|---|---|---|---|
| 9,853,748 B2 * | 12/2017 | Prendergast | ......... H04B 17/102 |
| 2019/0036563 A1 * | 1/2019 | Koshy | ................... H04W 52/18 |
| 2019/0140340 A1 * | 5/2019 | Ramasamy | .......... H01Q 1/2291 |
| 2019/0215765 A1 * | 7/2019 | Ramasamy | ......... H04W 52/243 |
| 2020/0195289 A1 * | 6/2020 | Chang | ................... H04W 52/18 |
| 2020/0336222 A1 * | 10/2020 | Rimini | ................ H04W 52/367 |

* cited by examiner

*Primary Examiner* — Jermele M Hollington
*Assistant Examiner* — Suresh K Rajaputra
(74) *Attorney, Agent, or Firm* — Larson Newman, LLP

(57) ABSTRACT

An information handling system includes a data radio connected to an antenna system, and a proximity sensor connected to a proximity sensor probe. An antenna controller (AC) may determine whether a capacitance measurement coarsely indicates a specific antenna configuration or a coarse fault; and configure, when the capacitance measurement indicates a coarse fault, a data radio to operate at a failsafe radio transmit power level; determine, when the capacitance measurement indicates the specific antenna configuration, whether a detail capacitance measured with respect to the antenna system indicates proper antenna configuration or an out-of-range value; configure, when the detail capacitance indicates proper antenna configuration, the data radio to operate normally; and configure, when the detail capacitance indicates an out-of-range value, the data radio to operated in a mode where a performance parameter of the data radio is particularly monitored.

18 Claims, 7 Drawing Sheets

US 11,747,381 B2

CAPACITIVE DETECTION OF ANTENNA CONFIGURATION USING A PROXIMITY SENSOR

FIELD OF THE DISCLOSURE

The present disclosure generally relates to information handling systems, and more particularly relates to capacitive detection of antenna configuration using a proximity sensor.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes a data radio connected to an antenna system, and a proximity sensor connected to a proximity sensor probe. An antenna controller (AC) may determine whether a capacitance measurement coarsely indicates a specific antenna configuration or a coarse fault; and configure, when the capacitance measurement indicates a coarse fault, a data radio to operate at a failsafe radio transmit power level; determine, when the capacitance measurement indicates the specific antenna configuration, whether a detail capacitance measured with respect to the antenna system indicates proper antenna configuration or an out-of-range value; configure, when the detail capacitance indicates proper antenna configuration, the data radio to operate normally; and configure, when the detail capacitance indicates an out-of-range value, the data radio to operated in a mode where a performance parameter of the data radio is particularly monitored.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
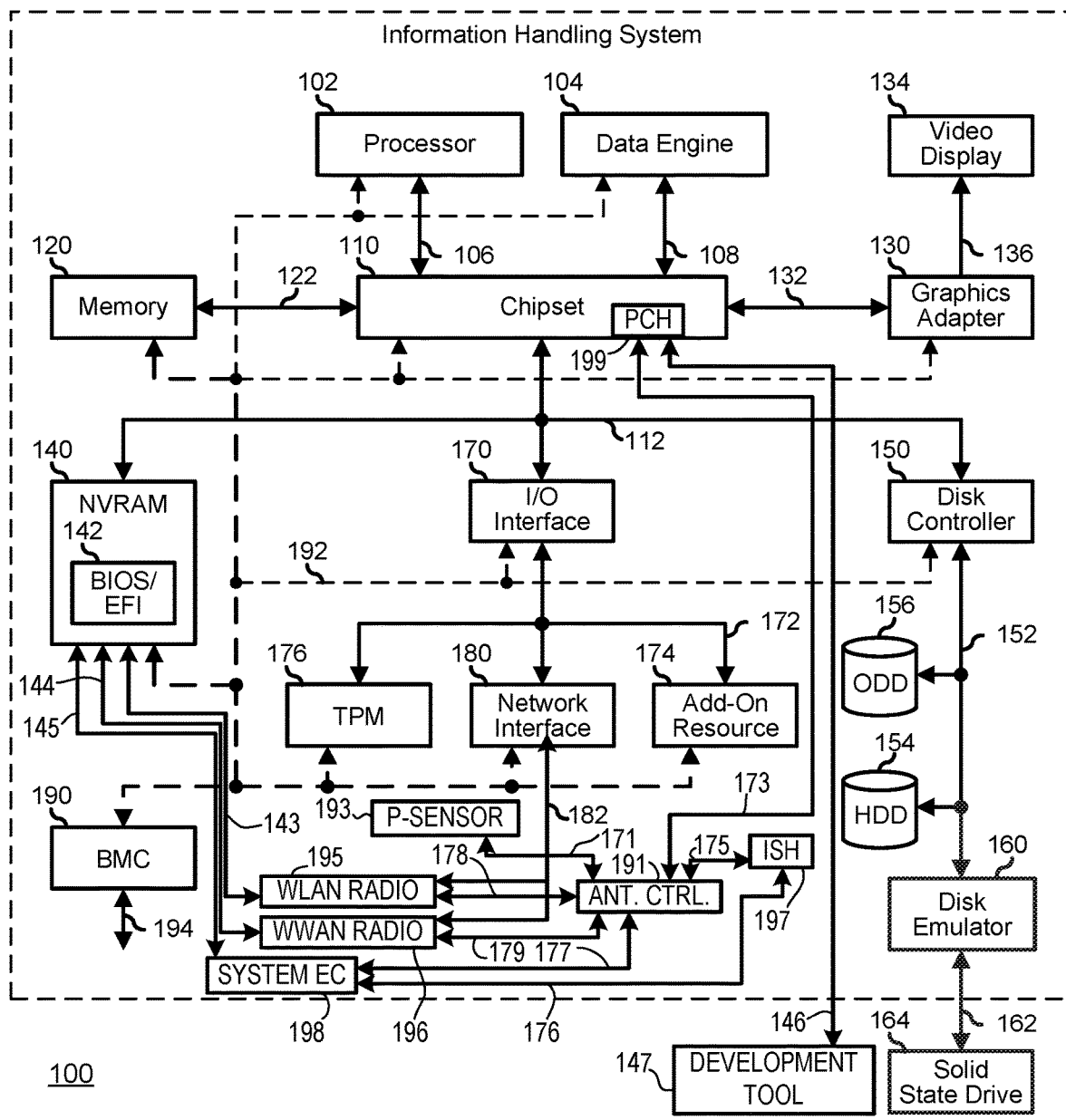
FIG. 1 is a block diagram illustrating an information handling system according to an embodiment of the present disclosure.

FIG. 1 illustrates a generalized embodiment of information handling system 100. For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a System-on-a-Chip (SoC), or other control logic hardware. Information handling system 100 can also include one or more computer-readable medium for storing machine-executable code, such as software or data. Additional components of information handling system 100 can include one or more storage devices that can store machine-executable code, one or more communications ports for communicating with external devices, and various input and output (I/O) devices, such as a keyboard, a mouse, and a video display. Information handling system 100 can also include one or more buses operable to transmit information between the various hardware components.

Information handling system 100 can include devices or modules that embody one or more of the devices or modules described above, and operates to perform one or more of the methods described above. Information handling system 100 includes a processors 102 and 104, a chipset 110, a memory 120, a graphics adapter 130, include a basic input and output system/extensible firmware interface (BIOS/EFI) module 140, a disk controller 150, a disk emulator 160, an input/output (I/O) interface 170, a network interface 180, baseboard management controller (BMC) 190, antenna controller (AC) 191, proximity sensor (P-sensor) 193, wireless local area network (WLAN) radio 195, wireless wide area network (WWAN) radio 196, integrated sensor hub (ISH) 197, and system embedded controller (EC) 198. Chipset 110 comprises platform controller hub (PCH) 199. Processor 102 is connected to chipset 110 via processor interface 106, and processor 104 is connected to chipset 110 via processor interface 108. Memory 120 is connected to chipset 110 via a memory bus 122. Graphics adapter 130 is connected to chipset 110 via a graphics interface 132, and provides a video display output 136 to a video display 134. In a particular embodiment, information handling system 100 includes separate memories that are dedicated to each of processors 102 and 104 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit (I²C) interface, a Serial Peripheral Interface (SPI), a Universal Serial Bus (USB), another interface, or a combination thereof. BIOS/EFI module 140 includes BIOS/EFI code operable to detect resources within information handling system 100, to provide drivers for the resources, initialize the resources, and access the resources. BIOS/EFI module 140 includes code that operates to detect resources within information handling system 100, to provide drivers for the resources, to initialize the resources, and to access the resources.

Disk controller 150 includes a disk interface 152 that connects the disc controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits a solid-state drive 164 to be connected to information handling system 100 via an external interface 162. An example of external interface 162 includes a USB interface, an IEEE 1194 (Firewire) interface, a proprietary interface, or a combination thereof. Alternatively, solid-state drive 164 can be disposed within information handling system 100.

I/O interface 170 includes a peripheral interface 172 that connects the I/O interface to an add-on resource 174 and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a NIC disposed within information handling system 100, on a main circuit board of the information handling system, integrated onto another component such as chipset 110, in another suitable location, or a combination thereof. Network interface device 180 includes network channel 182 that can provide an interface to devices that are internal or external to information handling system 100. In a particular embodiment, network channel 182 of a different type than peripheral channel 172 and network interface 180 translates information from a format suitable to the peripheral channel to a format suitable to external devices. An example of network channel 182 includes InfiniBand channels, Fibre Channel channels, Gigabit Ethernet channels, proprietary channel architectures, or a combination thereof. Network channel 182 can be connected to external network resources (not illustrated), either directly or via component such as WLAN radio 195, WWAN radio 196, or both. The network resource can include another information handling system, a data storage system, another network, a grid management system, another suitable resource, or a combination thereof.

BMC 190 is connected by a management interface 192 to a plurality of system components, such as processor 102, processor 104, memory 120, chipset 110, graphics adapter 130, I/O interface 170, disk controller 150, NVRAM module 140, TPM 176, network interface 180, and add-on resource 174. BMC 190 is connected to an external management interface 194 for platform management by an external IHS.

Network interface 180 is connected to WLAN radio 195 and WWAN radio 196 via network channel 182. WLAN radio 195 is connected to antenna controller (AC) 191 via interconnect 178. WWAN radio 196 is connected to AC 191 via interconnect 179. AC 191 is connected to proximity sensor (P-sensor) 193 via interconnect 171. AC 191 is connected to integrated system hub (ISH) 197 via interconnect 175. ISH 197 is connected to system embedded controller (EC) 198 via interconnect 176. AC 191 is connected to system EC 198 via interconnect 177. System EC 198 is connected to NVRAM 140 including BIOS/EFI 142 via interconnect 145. NVRAM 140 is connected to WLAN radio 195 via interconnect 143. NVRAM 140 is connected to WWAN radio 195 via interconnect 144. AC 191 is connected to platform controller hub (PCH) 199 via interconnect 173. PCH 199 can be connected to a development tool 147 via interconnect 146. Elements within IHS 100 can be implemented as described using similar names with respect to elements shown on other drawings described below.

Figure 2:
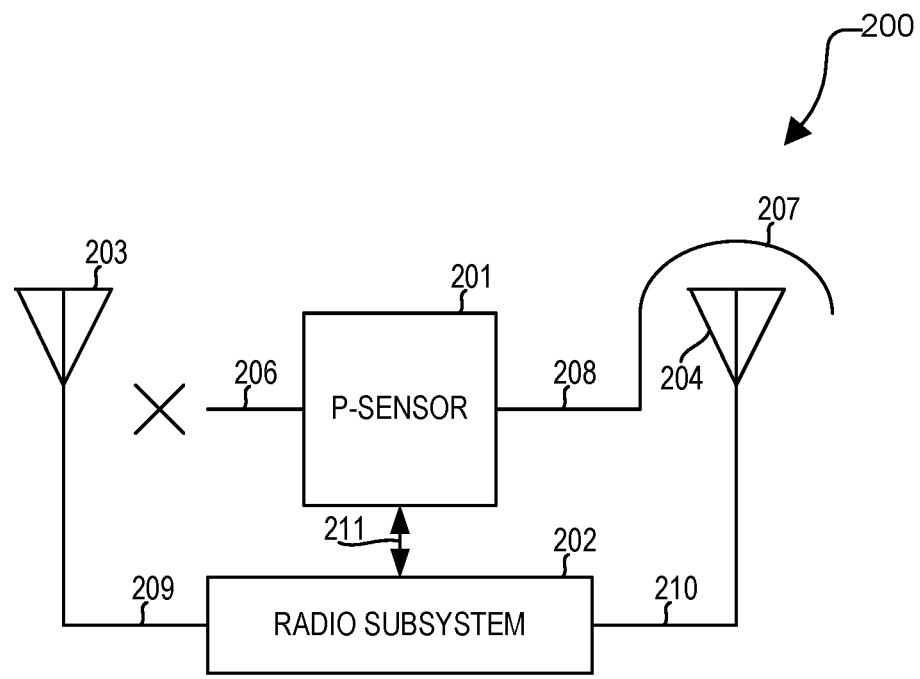
FIG. 2 is a block diagram illustrating a system in an exemplary first configuration for capacitive detection of antenna configuration using a proximity sensor according to an embodiment of the present disclosure.

FIG. 2 shows a system in an exemplary first configuration for capacitive detection of antenna configuration using a proximity sensor according to an embodiment of the present disclosure. System 200 includes proximity sensor (P-sensor) 201, radio subsystem 202, antenna 203, antenna 204, and capacitive sensor 207. Capacitive sensor is located proximate to antenna 204. Radio subsystem 202 is connected to antenna 203 via transmission line 209. Radio subsystem 202 is connected to antenna 204 via transmission line 210. Radio subsystem 202 is connected to P-sensor 201 via interconnect 211. P-sensor 201 is connected to capacitive sensor 207 via interconnect 208 in the first configuration. Interconnect 206 of P-sensor 201 is left unconnected in the first configuration.

P-sensor 201 is able to use a capacitive sensing circuit to detect that interconnect 206 is unconnected, that interconnect 208 is connected, that capacitive sensor 207 is connected, and that capacitive sensor 207 is properly located proximate to antenna 204, as well as to recognize the particular model, as may be designated by a stock keeping unit (SKU), of antenna 204 by matching a capacitance measurement of a capacitance between capacitive sensor 207 and antenna 204 with stored capacitance information characteristic of the SKU of antenna 204 among other SKUs of other antennas. For example, one SKU may represent an antenna configuration for basic operation and another SKU may represent an antenna configuration with more advanced features, and several of such antenna configurations can be supported under common component of an IHS, where the same model of the common component may be used in different IHSs having different SKUs for their different antenna configurations.

As an example, each SKU can represent a specific model of a part or parts that may be installed to provide a respective particular hardware configuration of an IHS or a subsystem of an IHS. The ability of p-sensor 201 to use the capacitive sensing circuit alternatively to detect the relative absence of capacitance in relation to an antenna allows it to detect unconnected interconnect 206. Capacitance anomalies associated with different configurations and different faults that may occur for particular configuration can be useful for detecting faults in cabling, uninstalled capacitive sensors, dislodged capacitive sensors, uninstalled antennas, and dislodged antennas. The relative absence of capacitance may, for example, be a greatly reduced capacitance value relative to an expected capacitance value if a capacitive sensor were connected to interconnect 206.

Figure 3:
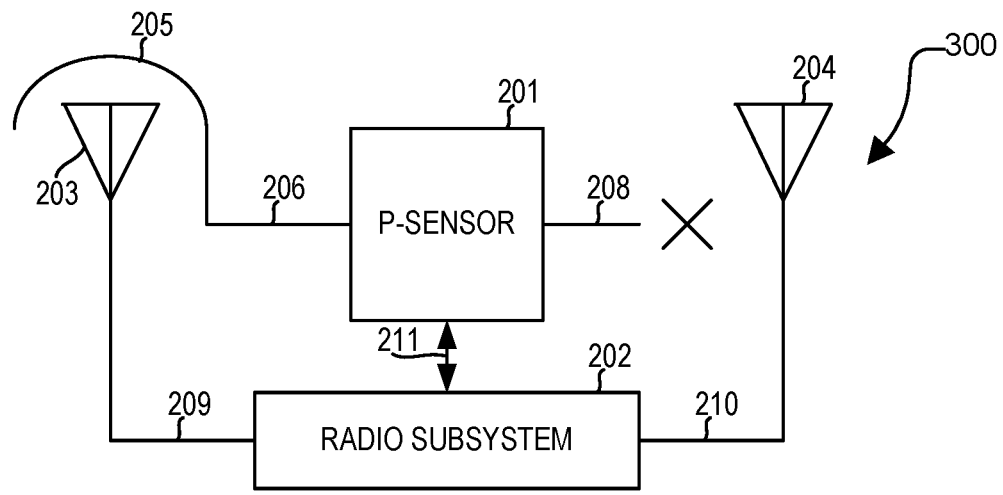
FIG. 3 is a block diagram illustrating a system in an exemplary second configuration for capacitive detection of antenna configuration using a proximity sensor according to an embodiment of the present disclosure.

FIG. 3 shows a system in an exemplary second configuration for capacitive detection of antenna configuration using a proximity sensor according to an embodiment of the present disclosure. System 300 is similar to system 200 of FIG. 2 except, in the second configuration, capacitive sensor 207 is not present, interconnect 208 is left unconnected, capacitive sensor 205 is present, P-sensor 201 is connected to capacitive sensor 205 via interconnect 206. Capacitive sensor 205 is located proximate to antenna 203. P-sensor 201 is able to use a capacitive sensing circuit to detect that interconnect 208 is unconnected, that interconnect 206 is connected, that capacitive sensor 205 is connected, and that capacitive sensor 205 is properly located proximate to antenna 203, as well as to recognize the particular model, as may be designated by a SKU, of antenna 203 by matching a capacitance measurement of a capacitance between capacitive sensor 205 and antenna 203 with stored capacitance information characteristic of the SKU of antenna 203 among other SKUs of other antennas. Other values of capacitance or lack thereof can be used by P-sensor 201 to recognize faults in cabling, uninstalled capacitive sensors, dislodged capacitive sensors, uninstalled antennas, and dislodged antennas. As an example, P-sensor 201 can detect unconnected interconnect 208 in the second configuration.

Figure 4:
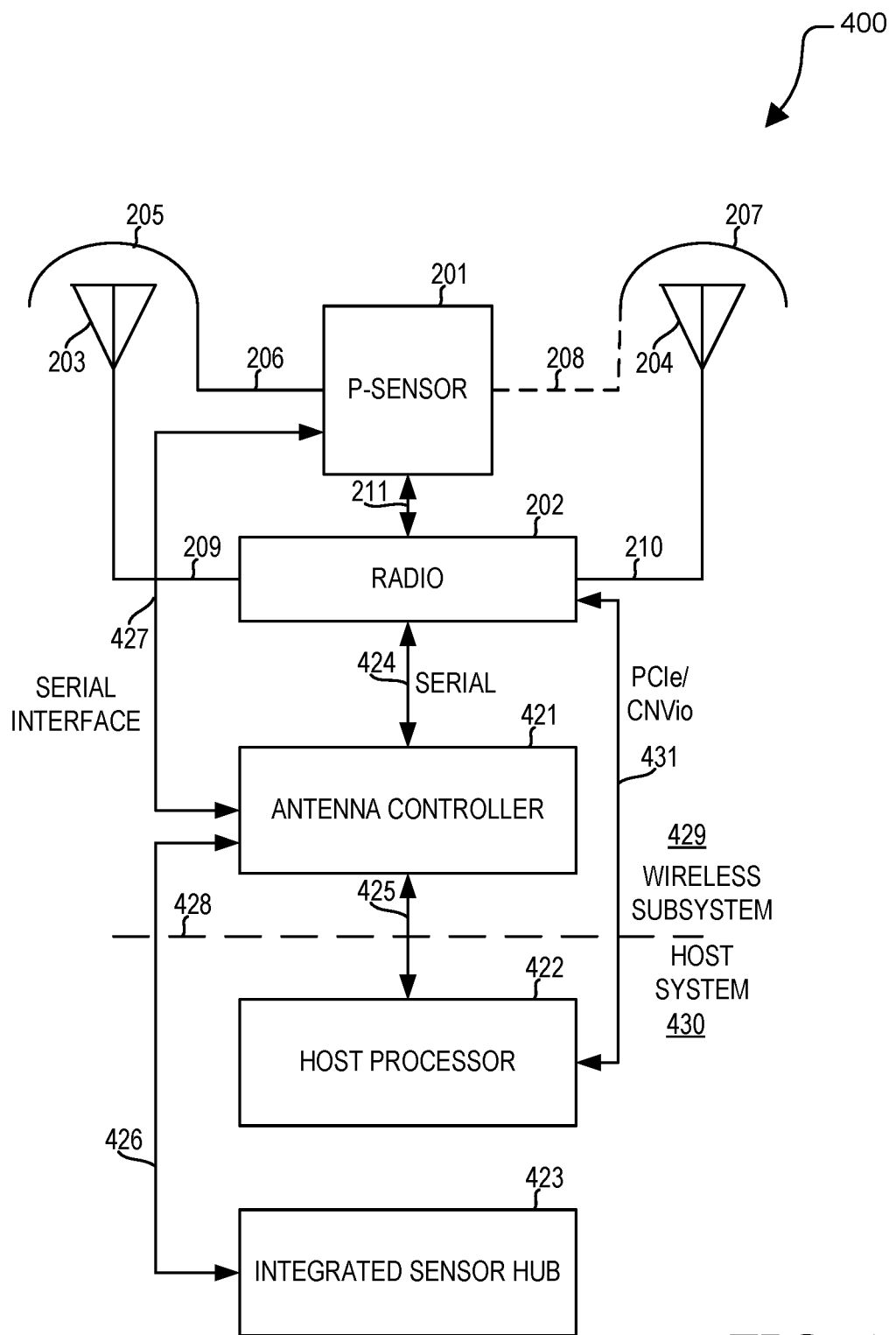
FIG. 4 is a block diagram illustrating a system for capacitive detection of antenna configuration using a proximity sensor according to an embodiment of the present disclosure.

FIG. 4 shows a system for capacitive detection of antenna configuration using a proximity sensor according to an embodiment of the present disclosure. System 400 includes a wireless subsystem 429 and host subsystem 430. Wireless subsystem 429 includes P-sensor 201, radio 202, antenna 203, antenna 204, capacitive sensor 205, capacitive sensor 207, and antenna controller 421. Host subsystem includes host processor 422 and integrated sensor hub (ISH) 423. Radio 202 is a data radio configured to transmit wirelessly data to and from the IHS in which it is installed. In the configuration shown, P-sensor 201 is connected to capacitive sensor 205 via interconnect 206. P-sensor may or may not be connected to capacitive sensor 207 via interconnect 208, as shown by the dashed line representing interconnect 208. For example, if a fault occurs in interconnect 208 or its connections to either of P-sensor 201 or capacitive sensor 207, P-sensor 201 may lose its connection with capacitive sensor 207, and such a loss of connection is detectable by P-sensor 201 using measurement of capacitance.

As an example, P-sensor 201 can apply a voltage to interconnect 208 in a driving mode then switch to a sensing mode, where the applied voltage is removed and a resistance is applied in parallel with the capacitance, and measure a measured voltage on interconnect 208, where the measured voltage can have a value as a mathematical function of the applied voltage, the resistance, the capacitance, and time. As the voltage across a discharging capacitor can be expressed as $V_C = V_0 e^{-t/RC}$, where $V_0$ is the voltage to which the capacitor was charged, R is the resistance of the parallel resistance, C is the capacitance, and t is the time elapsed during the discharging of the capacitor, such a mathematical relationship may be used to measure an unknown capacitance. The product of R multiplied by C can be referred to as a time constant τ, and, when charge on a capacitance C is discharged through a resistance R, the voltage across the capacitor will fall to 63.2% of the voltage to which the capacitor was charged after discharging has occurred for a time τ. Thus, as an example, P-sensor can charge the capacitance to be measured to a voltage $V_0$, then discharge the capacitance through a parallel resistor R, measuring the time t until the voltage decreases to $0.632*V_0$, with the measured capacitance equal to the measured time divided by the parallel resistance value.

As another example, P-sensor 201 can measure a time t to charge the capacitance C to given voltage $V_C$ through a series resistance R, which P-sensor 201 may insert between the voltage $V_B$ it applies and the capacitance C to be measured. For example, P-sensor 201 can apply a voltage $V_B$ through a resistance R to charge a capacitance C, measuring the time t it takes for the capacitance C to charge to a voltage $V_C$ of $0.632*V_B$ to determine a time constant τ for the resistance R and the capacitance C, then that measured time t can be divided by the resistance R to obtain the measurement of the capacitance C.

As yet another example, P-sensor 201 can work cooperatively with radio 202 to apply a varying signal to one of an antenna or a capacitive sensor in proximity to the antenna and to measure the relative amplitude of a received signal at the other of the antenna or capacitive sensor, as the coupling of a varying signal, such as an alternating current (AC) signal, between the antenna and the capacitive sensor, in either direction, will be a function of the capacitance between them, the frequency of the signal, and the source impedance driving the signal. The capacitive reactance of the capacitance C at a frequency f can be expressed as $X_C=1/(2*pi*f*C)$, and that capacitive reactance can form a voltage divider with the source impedance of the voltage source driving the applied signal, allowing the reduced voltage provided by the voltage divider to be measured and, by calculation, the capacitance to be measured.

P-sensor 201 is connected to radio 202 via interconnect 211. Radio 202 is connected to antenna 203 via transmission line 209. Radio 202 is connected to antenna 204 via transmission line 210. Radio 202 is connected to antenna controller (AC) 421 via interconnect 424. As an example, interconnect 424 may be an interconnect such as a serial communication line. AC 421 is connected to P-sensor 201 via interconnect 427, which may provide a serial interface between AC 421 and P-sensor 201. AC 421 can use interconnect 427 or interconnect 424 to cause P-sensor 201 to perform a capacitance measurement between capacitive sensor 205 and antenna 203, a capacitance measurement between capacitive sensor 207 and antenna 204, or both. AC 421 is connected to host processor 422 via interconnect 425. Host processor 422 can use interconnect 425 to cause AC 421 to request P-sensor 201 to perform a capacitance measurement. Host processor 422 is connected to radio 202 via interconnect 431, which may, for example, be a peripheral component interconnect express (PCIe) or connectivity integration input-output (CNVio) interconnect. AC 421 is connected to integrated sensor hub (ISH) 423 via interconnect 426.

Figure 5:
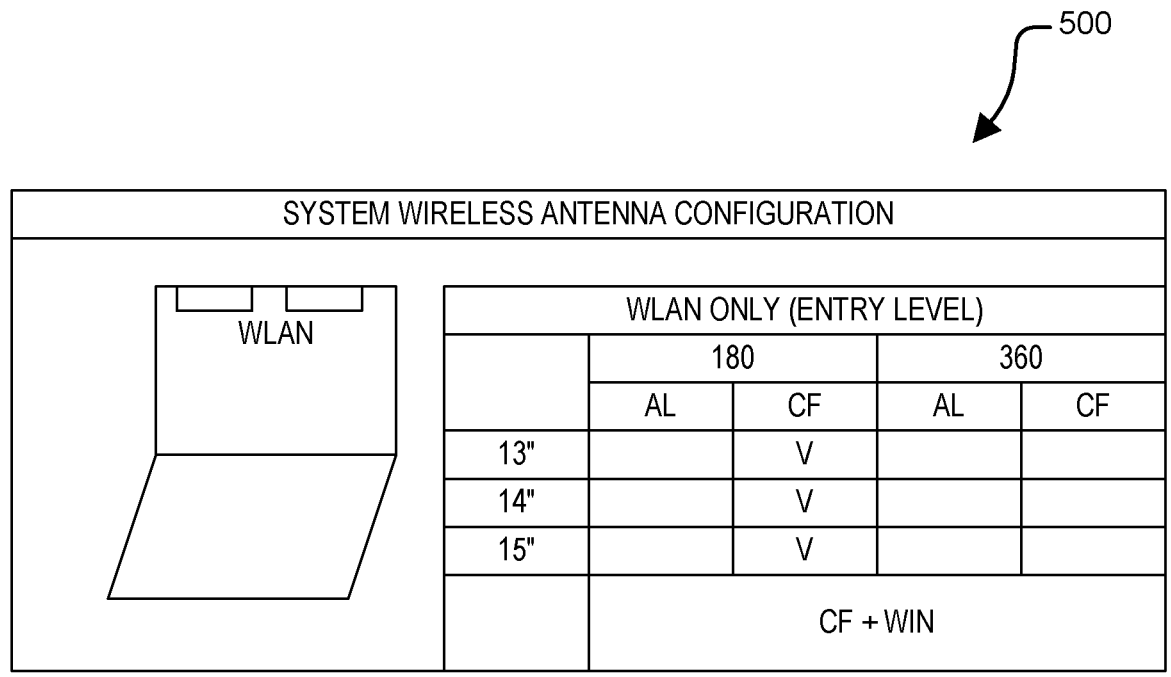
FIG. 5 is a tabular diagram illustrating a system wireless antenna configuration table for an entry-level wireless-local-area-network-only (WLAN-only) antenna configuration according to an embodiment of the present disclosure.

FIG. 5 shows a system wireless antenna configuration table for an entry-level wireless-local-area-network-only (WLAN-only) antenna configuration according to an embodiment of the present disclosure. As shown in table 500, an IHS having a entry-level WLAN-only antenna configuration may, for example, have two WLAN antennas located along a top edge of a display panel. Table 500 may include entries for IHS models having different display sizes, such as thirteen inches, fourteen inches, and fifteen inches, and may show which IHS usage configuration modes and IHS housing materials are supported according to the entry-level WLAN-only antenna configuration, which may be denoted by a SKU assigned to it. As examples, IHS usage configuration modes may include a notebook mode (for example 180-degree mode), where a display panel is presented at an angle to a keyboard, and a tablet mode (for example 360-degree mode), where a touch screen is used for input and display without a need to present a mechanical keyboard for user interaction with the IHS.

As examples of IHS housing materials, a panel made of metal (such as aluminum) with a radio-signal-transparent window, a panel made of a composite material (such as carbon fiber) with a radio-signal-transparent window, a windowless panel of metal (such as aluminum), or a windowless panel of composite material (such as carbon fiber) may be provided. In the entry-level WLAN-only example of FIG. 5, a windowed composite (such as carbon fiber with window) IHS housing material is supported in a notebook (for example 180-degree) mode, as shown in table 500. AC 421 can consult table 500 in relation to a capacitance measurement to determine which capacitance measurement is appropriate or what capacitance measurement values should be expected, or to identify the IHS as being configured in accordance with table 500.

Figure 6:
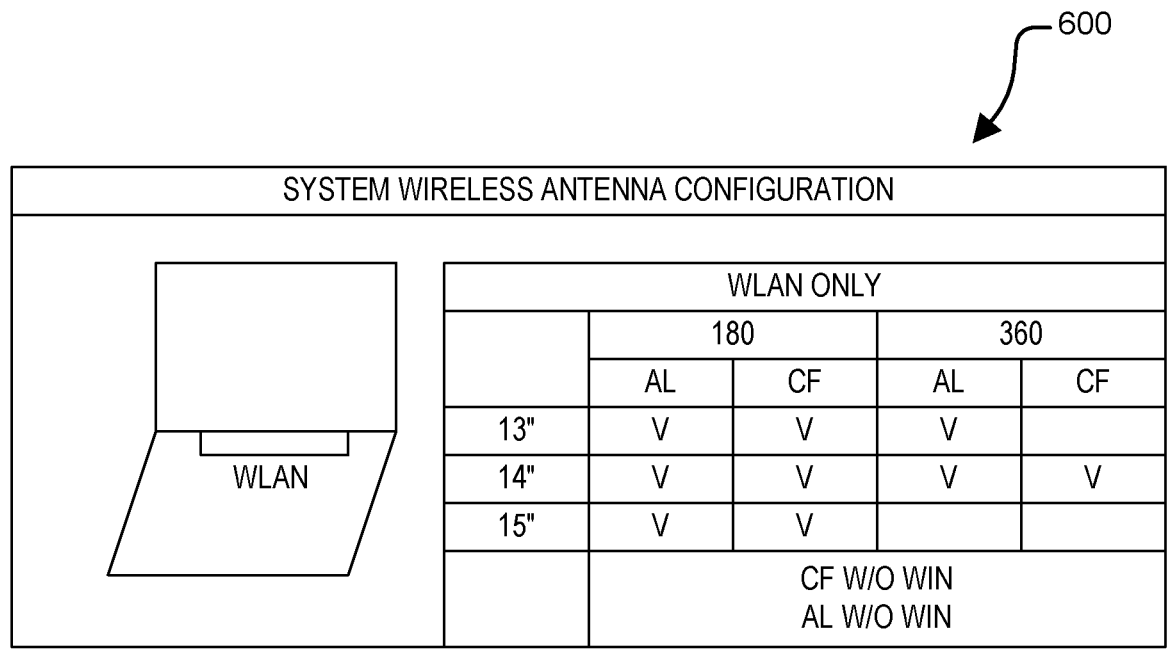
FIG. 6 is a tabular diagram illustrating a system wireless antenna configuration table for a WLAN-only antenna configuration according to an embodiment of the present disclosure.

FIG. 6 shows a system wireless antenna configuration table for a WLAN-only antenna configuration according to an embodiment of the present disclosure. As shown in table 600, an IHS having a WLAN-only antenna configuration may, for example, have one WLAN antenna located in base portion of the IHS near a hinge with the display portion of the IHS. Table 600 includes entries for models having different display sizes, such as thirteen inches, fourteen inches, and fifteen inches, and shows which IHS usage configuration modes and IHS housing materials are supported according to the WLAN-only antenna configuration, which may be denoted by a SKU assigned to it.

In the WLAN-only example of FIG. 6, a windowless metal (such as aluminum without window) IHS housing material and a composite (such as carbon fiber without window) IHS housing material are supported in both a notebook (for example 180-degree) mode and a tablet (for example 360-degree) mode for an IHS with a fourteen-inch display, but for an IHS with a thirteen-inch display, the windowless composite IHS housing material is shown not to support the tablet (for example 360-degree) mode, while other materials and modes are supported, and, for an IHS with a 15-inch display, the tablet (for example 360-degree) mode is shown as not being supported for either the windowless metal or the windowless composite IHS housing materials, as shown in table 600. AC 421 can consult table 600 in relation to a capacitance measurement to determine which capacitance measurement is appropriate or what capacitance measurement values should be expected, or to identify the IHS as being configured in accordance with table 600.

Figure 7:
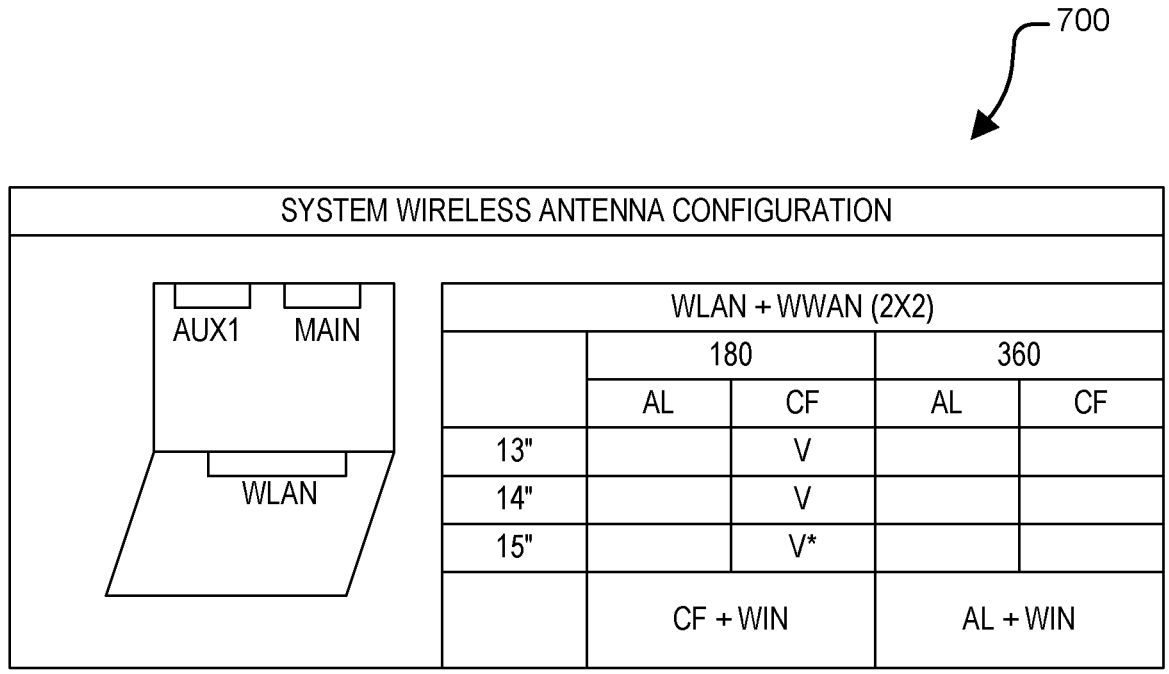
FIG. 7 is a tabular diagram illustrating a system wireless antenna configuration table for a wireless-local-area-network-and-wireless-wide-area-network (WLAN-and-WWAN) 2×2 antenna configuration according to an embodiment of the present disclosure.

FIG. 7 shows a wireless antenna configuration table for a wireless-local-area-network-and-wireless-wide-area-network (WLAN-and-WWAN) 2×2 antenna configuration according to an embodiment of the present disclosure. As shown in table 700, an IHS having a WLAN-and-WWAN 2×2 antenna configuration may, for example, have one WLAN antenna located in base portion of the IHS near a hinge with the display portion of the IHS, a main antenna in one upper corner of a display panel and a first auxiliary antenna in another upper corner of the display panel. Table 700 includes entries for models having different display sizes, such as thirteen inches, fourteen inches, and fifteen inches, and shows which IHS usage configuration modes and IHS housing materials are supported according to the WLAN-and-WWAN 2×2 antenna configuration, which may be denoted by a SKU assigned to it.

In the WLAN-and-WWAN 2×2 example of FIG. 7, a windowed composite (such as carbon fiber with window) IHS housing material supports a notebook (such as 180-degree) mode for all display sizes, as shown in table 700. AC 421 can consult table 700 in relation to a capacitance measurement to determine which capacitance measurement is appropriate or what capacitance measurement values should be expected, or to identify the IHS as being configured in accordance with table 700.

Figure 8:
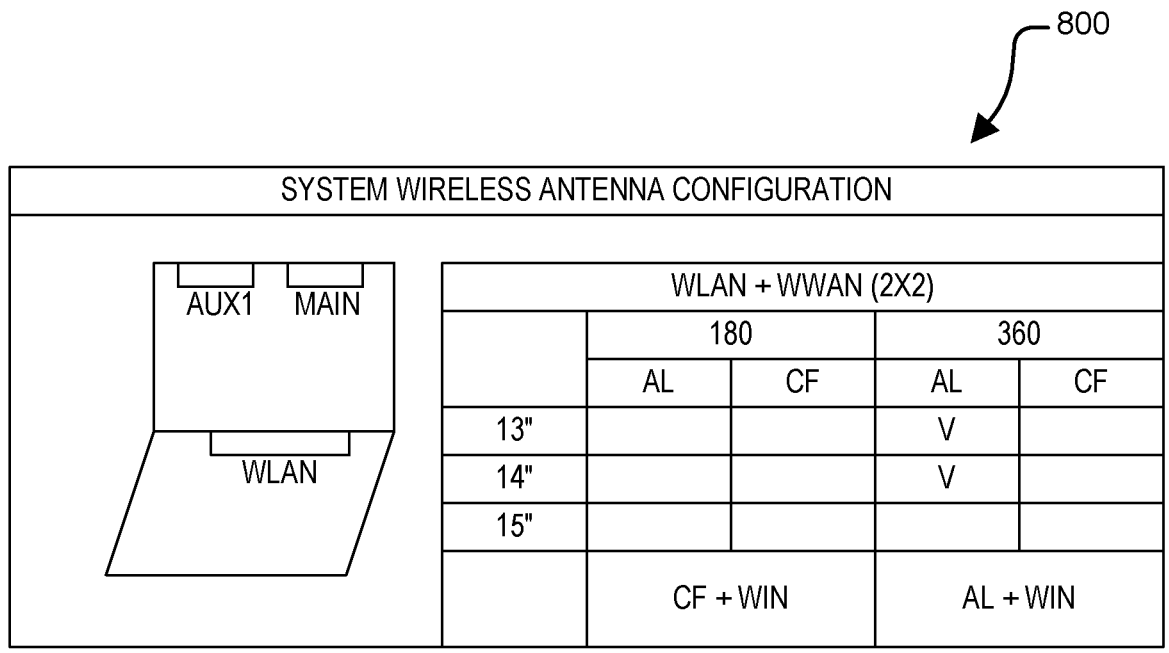
FIG. 8 is a tabular diagram illustrating a system wireless antenna configuration table for a WLAN-and-WWAN 2×2 antenna configuration according to an embodiment of the present disclosure.

FIG. 8 shows a system wireless antenna configuration table for a WLAN-and-WWAN 2×2 antenna configuration according to an embodiment of the present disclosure. As shown in table 800, an IHS having a WLAN-and-WWAN 2×2 antenna configuration may, for example, have one WLAN antenna located in base portion of the IHS near a hinge with the display portion of the IHS, a main antenna in one upper corner of a display panel and a first auxiliary antenna in another upper corner of the display panel. Table 800 includes entries for models having different display sizes, such as thirteen inches, fourteen inches, and fifteen inches, and shows which IHS usage configuration modes and IHS housing materials are supported according to the WLAN-and-WWAN 2×2 antenna configuration, which may be denoted by a SKU assigned to it.

In the WLAN-and-WWAN 2×2 example of FIG. 8, a windowed metal (such as aluminum with window) IHS housing material supports a tablet (such as 360-degree) mode for the 13-inch and 14-inch, but not the 15-inch, display sizes, as shown in table 800. AC 421 can consult table 800 in relation to a capacitance measurement to determine which capacitance measurement is appropriate or what capacitance measurement values should be expected, or to identify the IHS as being configured in accordance with table 800.

Figure 9:
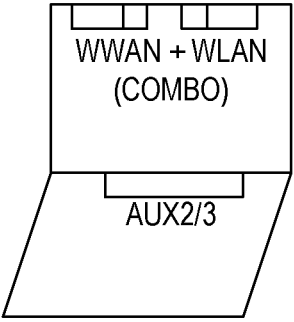
FIG. 9 is a tabular diagram illustrating a system wireless antenna configuration table for a WLAN-and-WWAN 4×4 antenna configuration according to an embodiment of the present disclosure.

FIG. 9 shows a system wireless antenna configuration table for a WLAN-and-WWAN 4×4 antenna configuration according to an embodiment of the present disclosure. As shown in table 900, an IHS having a WLAN-and-WWAN 4×4 antenna configuration may, for example, have a WLAN-and-WWAN antenna combination including a first WLAN-and-WWAN antenna in a first upper corner of a display panel and a second WLAN-and-WWAN antenna in a second upper corner of the display panel and one or more auxiliary antennas located in base portion of the IHS near a hinge with the display portion of the IHS. The WLAN-and-WWAN antennas are combination antennas capable of operating as both WLAN antennas and WWAN antennas. Table 900 includes entries for models having different display sizes, such as 13 inches, 14 inches, and 15 inches, and shows which IHS usage configuration modes and IHS housing materials are supported according to the WLAN-and-WWAN 4×4 antenna configuration, which may be denoted by a SKU assigned to it. In the WLAN-and-WWAN 4×4 example of FIG. 9, a windowed composite (such as carbon fiber with window) IHS housing material is shown as supporting a notebook (such as 180-degree) mode for all display sizes, as shown in table 900. AC 421 can consult table 900 in relation to a capacitance measurement to determine which capacitance measurement is appropriate or what capacitance measurement values should be expected, or to identify the IHS as being configured in accordance with table 900.

Figure 10:
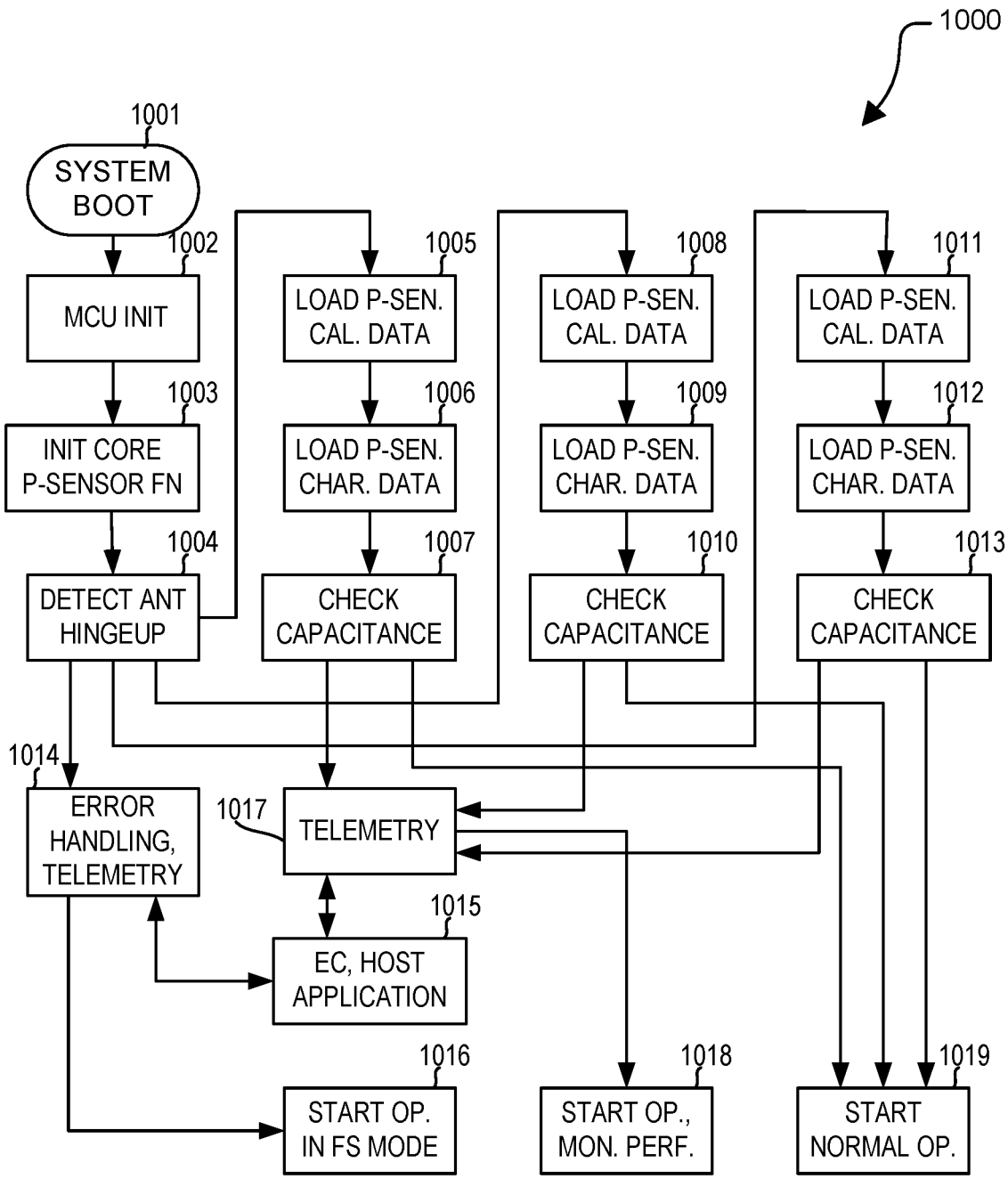
FIG. 10 is a flow diagram illustrating a method for capacitive detection of antenna configuration using a proximity sensor.

FIG. 10 shows a method for capacitive detection of antenna configuration using a proximity sensor. Method 1000 begins at block 1001 with an initialization (such as booting up) of the IHS. From block 1001, method 1000 continues to block 1002. At block 1002, a microcontroller (MCU) (such as a MCU of AC 421) is initialized. From block 1002, method 1000 continues to block 1003. At block 1003, a core P-sensor function is initialized, such as a core P-sensor function of P-sensor 201. From block 1003, method 1000 continues to block 1004. At block 1004, a capacitance measurement is performed, and a coarse capacitance measurement is obtained. The coarse capacitance measurement can be used to detect an antenna physical configuration of the IHS from among multiple possible antenna physical configurations.

Such possible antenna physical configurations can be referred to as particular hingeups, where one particular hingeup may be selected to be installed on an IHS when it is assembled, for example, at a factory. As a first example, if a first antenna physical configuration is detected, method 1000 continues from block 1004 to block 1005, where blocks 1005 through 1007 correspond to the first antenna physical configuration. As a second example, if a second antenna physical configuration is detected, method 1000 continues from block 1004 to block 1008, where blocks 1008 through 1010 correspond to the second antenna physical configuration. As a third example, if an nth (such as third) antenna physical configuration is detected, method 1000 continues from block 1004 to block 1011, where blocks 1011 through 1013 correspond to the nth antenna physical configuration. Any other number of antenna physical configurations, from 1 to n, can be similarly supported.

For the first antenna physical configuration, P-sensor calibration data are loaded at block 1005. From block 1005, method 1000 continues to block 1006. At block 1006, P-sensor characterization data are loaded. From block 1006, method 1000 continues to block 1007. At block 1007, a detail capacitance value is obtained. The detail capacitance value can be obtained from the capacitance measurement of block 1004, or a new capacitance measurement can be performed. The detail capacitance value can be used to determine a proper physical connection of the first antenna physical configuration. If a proper physical connection is determined to exist, for example, by the detail capacitance value being within a defined range of a prescribed value, which may be obtained from a stored table, method 1000 continues from block 1007 to block 1019, where normal operation of the wireless subsystem is started. If the detail capacitance is out of range, indicating an error in the physical connection of the first antenna physical configuration, method 1000 continues from block 1007 to block 1017, where telemetry describing the error is communicated, for example, to an embedded controller (EC) or host application of block 1015. From block 1017, method 1000 continues to block 1018, where operation of the wireless subsystem is started in a performance-monitoring mode, where any effect of the out-of-range capacitance value can be analyzed during operation.

For the second antenna physical configuration, P-sensor calibration data are loaded at block 1008. From block 1008, method 1000 continues to block 1009. At block 1009, P-sensor characterization data are loaded. From block 1009, method 1000 continues to block 1010. At block 1010, a detail capacitance value is obtained. The detail capacitance value can be obtained from the capacitance measurement of block 1004, or a new capacitance measurement can be performed. The detail capacitance value can be used to determine a proper physical connection of the second antenna physical configuration. If a proper physical connection is determined to exist, for example, by the detail capacitance value being within a defined range of a prescribed value, which may be obtained from a stored table, method 1000 continues from block 1010 to block 1019, where normal operation of the wireless subsystem is started.

If the detail capacitance is out of range, indicating an error in the physical connection of the first antenna physical configuration, method 1000 continues from block 1010 to block 1017, where telemetry describing the error is communicated, for example, to an embedded controller (EC) or host application of block 1015. From block 1017, method 1000 continues to block 1018, where operation of the wireless subsystem is started in a performance-monitoring mode, where any effect of the out-of-range capacitance value can be analyzed during operation.

For the third antenna physical configuration, P-sensor calibration data are loaded at block 1011. From block 1011, method 1000 continues to block 1012. At block 1012, P-sensor characterization data are loaded. From block 1012, method 1000 continues to block 1013. At block 1013, a detail capacitance value is obtained. The detail capacitance value can be obtained from the capacitance measurement of block 1004, or a new capacitance measurement can be performed. The detail capacitance value can be used to determine a proper physical connection of the third antenna physical configuration. If a proper physical connection is determined to exist, for example, by the detail capacitance value being within a defined range of a prescribed value, which may be obtained from a stored table, method 1000 continues from block 1013 to block 1019, where normal operation of the wireless subsystem is started.

If the detail capacitance is out of range, indicating an error in the physical connection of the first antenna physical configuration, method 1000 continues from block 1013 to block 1017, where telemetry describing the error is communicated, for example, to an embedded controller (EC) or host application of block 1015. From block 1017, method 1000 continues to block 1018, where operation of the wireless subsystem is started in a performance-monitoring mode, where any effect of the out-of-range capacitance value can be analyzed during operation.

If, at block 1004, the course capacitance value is out of range, which could prevent identification of the antenna physical configuration or indicate an antenna physical configuration that is faulty or is disconnected from its data radio, method 1000 continues from block 1004 to block 1014. At block 1014, error handling is performed. Telemetry can be performed, for example, by communicating error information to an EC or host application in block 1015. As an example of error handling, a sensor function of P-sensor 201 can be disregarded, as a capacitive sensor or interconnect may be damaged or missing. Accordingly, when method 1000 continues from block 1014 to block 1016, radio 202 can be started using a failsafe radio transmit power level to assure a regulatorily compliant transmit power level in absence of functioning proximity sensing from P-sensor 201.

In accordance with at least one embodiment, a system and method for automated antenna physical configuration detection (such as SKU detection) and diagnostics using proximity-sensor capacitive detection are provided. As more options for wireless networking have become available, greater complexity of possible antenna physical configurations (such as SKUs) and their detection has arisen. By utilizing single motherboard and a single BIOS for several different antenna hingeups and radio combinations, there is a need for the system to understand what the current antenna configuration is in order to properly load compensation parameters and enable correct control algorithms. In the case of the wireless subsystem, systems that employ capacitive sensing for user proximity detection can use the capacitive sensor function to detect what specific antenna configuration is deployed based on measured capacitive load. The same method can also be used to self-check that the P-sensor connection is correct (such as to detect if connector is not properly mated to its socket or if the cable assembly is broken).

Capacitive antenna physical configuration detection can be used to provide automated accurate SKU detection. It can reduce system complexity by avoiding the need for additional circuitry and sensors, as a P-sensor and its sensing probes can be used to provide multiple functions, including SKU detection, antenna system integrity verification, and proximity sensing for radio transmit power level control when a user proximately approaches an antenna. Such functions can be used to automatically configure a wireless subsystem of an IHS for appropriate operation given the antenna physical configuration, any faults that may exist in the antenna system, and any proximity of a user to the antenna system, as may occur. Such functions can also provide automatic self-testing of wireless subsystem components, such as cable assemblies and their interconnections.

In accordance with at least one embodiment, a MCU, as may, for example, be embodied in an antenna controller is configured to detect a platform SKU (such as WWAN 4G, 5G or WLAN passive) by reading a P-Sensor capacitance threshold associated with an antenna of the wireless subsystem. In accordance with at least one embodiment, P-Sensor capacitance telemetry is provided, for example, in a factory or in service, to diagnose P-Sensor functionality by discerning a capacitance difference from an expected capacitance value, as may be caused during antenna assembly (such as depending on whether an antenna is not connected, poorly connected, or well connected). In accordance with at least one embodiment, statistical modeling of a measurement of a P-Sensor capacitive input is performed based on different capacitive sensor (such as antenna) elements and cable connections with different ranges, which can be used, for example, to detect a SKU of a wireless system, a subassembly thereof, or a part thereof, or, as another example, to determine if a connector has been properly mated to its socket and to provide telemetry, for example, in a factory or in service. In accordance with at least one embodiment, a capability is provided for platforms with single motherboard, with a single BIOS, and with a single operating system image to detect a SKU within the wireless subsystem, which can be used to configure sensors and actuators (such as switches, tuners, etc.) correctly in the front end of the wireless subsystem using MCU smart sensor management.

At least one embodiment enables the use of a single motherboard with a single firmware (BIOS, EC, antenna controller) with any of a plurality of SKUs for wireless subsystems, subassemblies thereof, or parts thereof, such as antennas. In accordance with at least one embodiment, statistical modeling of a measurement of the P-sensor capacitive input to determine if a capacitive sensor is connected or not. Since different capacitive sensor elements and their cable connections will have different ranges, and different antennas and their transmission lines will have different ranges, it is possible to detect which antenna configuration has been connected to a radio of a wireless subsystem of an IHS. It is also possible to determine if the connector has been properly mated to the socket or not.

In accordance with at least one embodiment, an antenna controller is configured to determine which antenna physical configuration (such as hingeup) is connected by analyzing the capacitance detected by the P-sensor circuit. Correct P-sensor calibration/characterization data can be loaded based on the determination of the antenna physical configuration. An antenna controller can also notify a core platform (such as a host processor) or an EC of the detected antenna hingeup. In accordance with at least one embodiment, a single platform can have multiple antenna configurations depending on what radios are populated in that specific shipping SKU. Thus, there can be a single motherboard, with a single BIOS, and a single operating system (OS) image generalized for compatibility with a range of antenna physical configurations, yet the frontend control can still be provided with detection of which SKU is the current one and thus can configure sensors and actuators (such as switches, tuners, etc.) correctly.

In accordance with at least one embodiment, the AC, in conjunction with the P-sensor, is able to detect if there are cables that have been damaged or connectors that have not been properly mated. For example, during the manufacturing cycle, self-test functionality can identify which cable to what sensor is either missing or is out of specification. As another example, for an end customer, a change in the detected capacitance from a nominal value could occur, for example, if the end user for instance drops the IHS and antennas or sensors are damaged. The antenna controller is configured to be able to detect these situations and to forward information, such as telemetry data, back to other systems under the OS in order to make the end user aware or to pre-wire customer support if the customer initiates a customer service contact.

In accordance with at least one embodiment, when a measured course range capacitance value is out-of-range, which can indicate a faulty antenna hingeup is assembled or a cable has come loose. Telemetry report can be provided, in a factory, to a production tool, or, in a normal mode of operation in service with a customer, to a service application executed on the host processor. In accordance with at least one embodiment, when an error occurs where a measured course range capacitance value cannot be correlated to a known hingeup, it can be concluded that a sensor function cannot be started due to a missing cable or a broken sensor. Thus, the AC is configured to command the radio to perform wireless operation in a failsafe mode (such as remaining always at low power) to assure regulatory compliance regardless of possible proximity of a user to an antenna of the wireless subsystem.

In accordance with at least one embodiment, when a measured fine range capacitance (such as detail capacitance) is out-of-range, it can be concluded that there may be some problem with a cable or a sensor (as may be caused by, for example, an assembly error, an end user dropping the device, etc.), the AC can communicate with EC and host side to check if other problems have been detected. The AC can also prepare telemetry be reported (such as to notify an end user or to send information to a service team to prepare to manage a customer service case). The AC can also start operation of the wireless subsystem with limited functionality, such as a limited radio transmit power level, which can assure regulatory compliance of the transmit power level.

In accordance with at least one embodiment, a method includes performing a capacitance measurement of antenna system; determining, at an antenna controller (AC), whether the capacitance measurement coarsely indicates a specific antenna configuration of a plurality of possible specific antenna configurations or a coarse fault; when the capacitance measurement indicates a coarse fault, configuring a data radio to operate at a failsafe radio transmit power level; when the capacitance measurement indicates the specific antenna configuration, determining, at the AC, whether a detail capacitance measured with respect to the antenna system indicates proper antenna configuration or an out-of-range value; when the detail capacitance indicates proper antenna configuration, configuring the data radio to operate normally; and, when the detail capacitance indicates an out-of-range value, configuring the data radio to operated in a mode where a performance parameter of the data radio is particularly monitored. In accordance with at least one embodiment, the method further includes loading specific calibration data for a proximity sensor, the proximity sensor used to perform the capacitance measurement. In accordance with at least one embodiment, the method further includes loading specific characterization data for the proximity sensor. In accordance with at least one embodiment, the method further comprises performing a second capacitance measurement to obtain the detail capacitance. In accordance with at least one embodiment, configuring the data radio to operate at the failsafe radio transmit power level is performed using a system embedded controller (EC) connected to the AC. In accordance with at least one embodiment, the specific antenna configuration corresponds to a particular stock keeping unit (SKU) of a plurality of installed antennas. In accordance with at least one embodiment, the coarse fault corresponds to a condition selected from a group consisting of a faulty proximity sensor probe, a faulty proximity sensor cable, and an improperly installed proximity sensor probe.

In accordance with at least one embodiment, an information handling system (IHS) comprises an antenna system; a data radio connected to the antenna system; a proximity sensor probe; a proximity sensor connected to the proximity sensor probe, the proximity sensor configured to perform a capacitance measurement of the antenna system; and an antenna controller (AC) connected to the data radio and to the proximity sensor, the AC configured to determine whether the capacitance measurement coarsely indicates a specific antenna configuration of a plurality of possible specific antenna configurations or a coarse fault, to configure, when the capacitance measurement indicates a coarse fault, a data radio to operate at a failsafe radio transmit power level, to determine, when the capacitance measurement indicates the specific antenna configuration, whether a detail capacitance measured with respect to the antenna system indicates proper antenna configuration or an out-of-range value, to configure, when the detail capacitance indicates proper antenna configuration, the data radio to operate normally, and to configure, when the detail capacitance indicates an out-of-range value, the data radio to operated in a mode where a performance parameter of the data radio is particularly monitored. In accordance with at least one embodiment, the AC is further configured to load specific calibration data for a proximity sensor, the proximity sensor used to perform the capacitance measurement. In accordance with at least one embodiment, the AC is further configured to load specific characterization data for the proximity sensor. In accordance with at least one embodiment, the proximity sensor is configured to perform a second capacitance measurement to obtain the detail capacitance. In accordance with at least one embodiment, configuring the data radio to operate at the failsafe radio transmit power level is performed using a system embedded controller (EC) connected to the AC. In accordance with at least one embodiment, the specific antenna configuration corresponds to a particular stock keeping unit (SKU) of a plurality of installed antennas. In accordance with at least one embodiment, the coarse fault corresponds to a condition selected from a group consisting of a faulty proximity sensor probe, a faulty proximity sensor cable, and an improperly installed proximity sensor probe.

In accordance with at least one embodiment, a method comprises performing, at a proximity sensor, a capacitance measurement of antenna system; determining, at an antenna controller (AC), whether the capacitance measurement coarsely indicates a specific antenna configuration of a multitude of possible specific antenna configurations or a coarse fault; when the capacitance measurement indicates a coarse fault, configuring a data radio to operate at a failsafe radio transmit power level; when the capacitance measurement indicates the specific antenna configuration, determining, at the AC, whether a detail capacitance measured with respect to the antenna system indicates proper antenna configuration or an out-of-range value; when the detail capacitance indicates proper antenna configuration, configuring the data radio to operate normally; and, when the detail capacitance indicates an out-of-range value, configuring the data radio to operated in a mode where a performance parameter of the data radio is particularly monitored. In accordance with at least one embodiment, the method further comprises loading specific calibration data for a proximity sensor. In accordance with at least one embodiment, the method further comprises loading specific characterization data for the proximity sensor. In accordance with at least one embodiment, the method further comprises performing a second capacitance measurement to obtain the detail capacitance. In accordance with at least one embodiment, configuring the data radio to operate at the failsafe radio transmit power level is performed using a system embedded controller (EC) connected to the AC. In accordance with at least one embodiment, the specific antenna configuration corresponds to a particular stock keeping unit (SKU) of a plurality of installed antennas.

For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, the information handling system can be a personal computer, a laptop computer, a smart phone, a tablet device or other consumer electronic device, a network server, a network storage device, a switch router or other network communication device, or any other suitable device and may vary in size, shape, performance, functionality, and price. Further, the information handling system can include processing resources for executing machine-executable code, such as a central processing unit (CPU), a programmable logic array (PLA), an embedded device such as a System-on-a-Chip (SoC), or other control logic hardware. An information handling system can also include one or more computer-readable medium for storing machine-executable code, such as software or data. Additional components of an information handling system can include one or more storage devices that can store machine-executable code, one or more communications ports for communicating with external devices, and various input and output (I/O) devices, such as a keyboard, a mouse, and a video display. Information handling systems can also include one or more buses operable to transmit information between the various hardware components.

When referred to as a "device," a "module," a "unit," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCM-CIA) card, or other such expansion card), or a system (such as a motherboard, a system-on-a-chip (SoC), or a stand-alone device).

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions or receives and executes instructions responsive to a propagated signal; so that a device connected to a network can communicate voice, video or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories.

Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A method comprising: performing a capacitance measurement of an antenna system; determining, at an antenna controller (AC), whether the capacitance measurement coarsely indicates a specific antenna configuration of a plurality of possible specific antenna configurations or a coarse fault; when the capacitance measurement indicates a coarse fault, configuring a data radio to operate at a failsafe radio transmit power level, wherein the coarse fault corresponds to a fault in a proximity sensor probe or the proximity sensor probe being improperly installed; when the capacitance measurement indicates the specific antenna configuration, determining, at the AC, whether a capacitance measured with respect to the antenna system indicates proper antenna configuration or an out-of-range value; when the capacitance indicates proper antenna configuration, configuring the data radio to be operated normally; and when the capacitance indicates an out-of-range value, configuring the data radio to be operated in a mode where a performance parameter of the data radio is particularly monitored.

2. The method of claim 1 further comprising:
loading specific calibration data for a proximity sensor, the proximity sensor used to perform the capacitance measurement.

3. The method of claim 2 further comprising:
loading specific characterization data for the proximity sensor.

4. The method of claim 1 further comprising:
performing a second capacitance measurement to obtain the capacitance.

5. The method of claim 1, wherein configuring the data radio to operate at the failsafe radio transmit power level is performed using a system embedded controller (EC) connected to the AC.

6. The method of claim 1, wherein the specific antenna configuration corresponds to a particular stock keeping unit (SKU) of a plurality of installed antennas.

7. An information handling system (IHS) comprising: an antenna system; a data radio connected to the antenna system; a proximity sensor probe; a proximity sensor connected to the proximity sensor probe, the proximity sensor configured to perform a capacitance measurement of the antenna system; and an antenna controller (AC) connected to the data radio and to the proximity sensor, the AC configured to determine whether the capacitance measurement coarsely indicates a specific antenna configuration of a plurality of possible specific antenna configurations or a coarse fault, wherein the coarse fault corresponds to a fault in the proximity sensor probe or the proximity sensor probe being improperly installed, to configure, when the capacitance measurement indicates a coarse fault, a data radio to operate at a failsafe radio transmit power level, to determine, when the capacitance measurement indicates the specific antenna configuration, whether a capacitance measured with respect to the antenna system indicates proper antenna configuration or an out-of-range value, to configure, when the capacitance indicates proper antenna configuration, the data radio to be operated normally, and to configure, when the capacitance indicates an out-of-range value, the data radio to be operated in a mode where a performance parameter of the data radio is particularly monitored.

8. The IHS of claim 7, wherein the AC is further configured to load specific calibration data for a proximity sensor, the proximity sensor used to perform the capacitance measurement.

9. The IHS of claim 8, wherein the AC is further configured to load specific characterization data for the proximity sensor.

10. The IHS of claim 7, wherein the proximity sensor is configured to perform a second capacitance measurement to obtain the capacitance.

11. The IHS of claim 7, wherein configuring the data radio to operate at the failsafe radio transmit power level is performed using a system embedded controller (EC) connected to the AC.

12. The IHS of claim 7, wherein the specific antenna configuration corresponds to a particular stock keeping unit (SKU) of a plurality of installed antennas.

13. A method comprising: performing, at a proximity sensor, a capacitance measurement of antenna system; determining, at an antenna controller (AC), whether the capacitance measurement coarsely indicates a specific antenna configuration of a plurality of possible specific antenna configurations or a coarse fault; if the capacitance measurement indicates a coarse fault, then configuring a data radio to operate at a failsafe radio transmit power level, wherein the coarse fault corresponds to a fault in the proximity sensor probe or the proximity sensor probe being improperly installed; if the capacitance measurement indicates the specific antenna configuration, then determining, at the AC, whether a capacitance measured with respect to the antenna system indicates proper antenna configuration or an out-of-range value; if the capacitance indicates proper antenna configuration, then configuring the data radio to be operated normally; and if the capacitance indicates an out-of-range value, then configuring the data radio to be operated in a mode where a performance parameter of the data radio is particularly monitored.

14. The method of claim 13 further comprising:
loading specific calibration data for a proximity sensor.

15. The method of claim 14 further comprising:
loading specific characterization data for the proximity sensor.

16. The method of claim 13, further comprising:
performing a second capacitance measurement to obtain the detail capacitance.

17. The method of claim 13, wherein configuring the data radio to operate at the failsafe radio transmit power level is performed using a system embedded controller (EC) connected to the AC.

18. The method of claim 13, wherein the specific antenna configuration corresponds to a particular stock keeping unit (SKU) of a plurality of installed antennas.

* * * * *